United States Patent [19]
Kuno et al.

[11] Patent Number: 5,640,440
[45] Date of Patent: Jun. 17, 1997

[54] SUBSTRATE CONVEYING SYSTEM

[75] Inventors: Mitsutoshi Kuno, Sagamihara; Kazunori Iwamoto, Utsunomiya; Mitsuji Marumo, Utsunomiya, all of Japan

[73] Assignee: Canon Kabushiki Kaisha, Tokyo, Japan

[21] Appl. No.: 504,235

[22] Filed: Jul. 19, 1995

[30] Foreign Application Priority Data

Jul. 19, 1994 [JP] Japan ................... 6-188933

[51] Int. Cl.⁶ .................................. H01L 21/68
[52] U.S. Cl. .................. 378/208; 378/34; 269/21
[58] Field of Search .................. 269/21; 378/34, 378/208, 204, 210; 250/491.1

[56] References Cited

U.S. PATENT DOCUMENTS

| | | |
|---|---|---|
| 4,719,705 | 1/1988 | Laganza et al. ............... 269/21 X |
| 4,854,444 | 8/1989 | Iwamoto . |
| 4,979,195 | 12/1990 | Tabata et al. ............ 378/208 X |
| 5,128,975 | 7/1992 | Iwamoto et al. . |
| 5,160,961 | 11/1992 | Marumo et al. . |
| 5,164,974 | 11/1992 | Kariya et al. ............... 378/34 |
| 5,168,512 | 12/1992 | Iwamoto et al. . |
| 5,191,218 | 3/1993 | Mori et al. . |
| 5,203,547 | 4/1993 | Marumo . |
| 5,226,523 | 7/1993 | Kawakami et al. . |
| 5,231,291 | 7/1993 | Amemiya et al. . |
| 5,398,271 | 3/1995 | Nishida et al. ............... 378/34 |
| 5,436,693 | 7/1995 | Marumo . |

*Primary Examiner*—David P. Porta
*Attorney, Agent, or Firm*—Fitzpatrick, Cella, Harper & Scinto

[57] ABSTRACT

A substrate conveying system includes an attracting device for attracting a substrate with reduced pressure, a moving device for relatively moving the substrate relative to the attracting device, and a detecting device for detecting the pressure of the attracting device during the relative movement of the substrate to thereby obtain positional information related to the substrate.

12 Claims, 10 Drawing Sheets

SUBSTRATE CONVEYING SYSTEM

FIELD OF THE INVENTION AND RELATED ART

This invention relates to a substrate conveying system usable in a semiconductor exposure apparatus, for example, for conveying a substrate such as a mask or a wafer to a positioning stage therefor, for example. In another aspect, the invention is concerned with an exposure apparatus which uses a substrate conveying system such as noted above.

Figure 9:
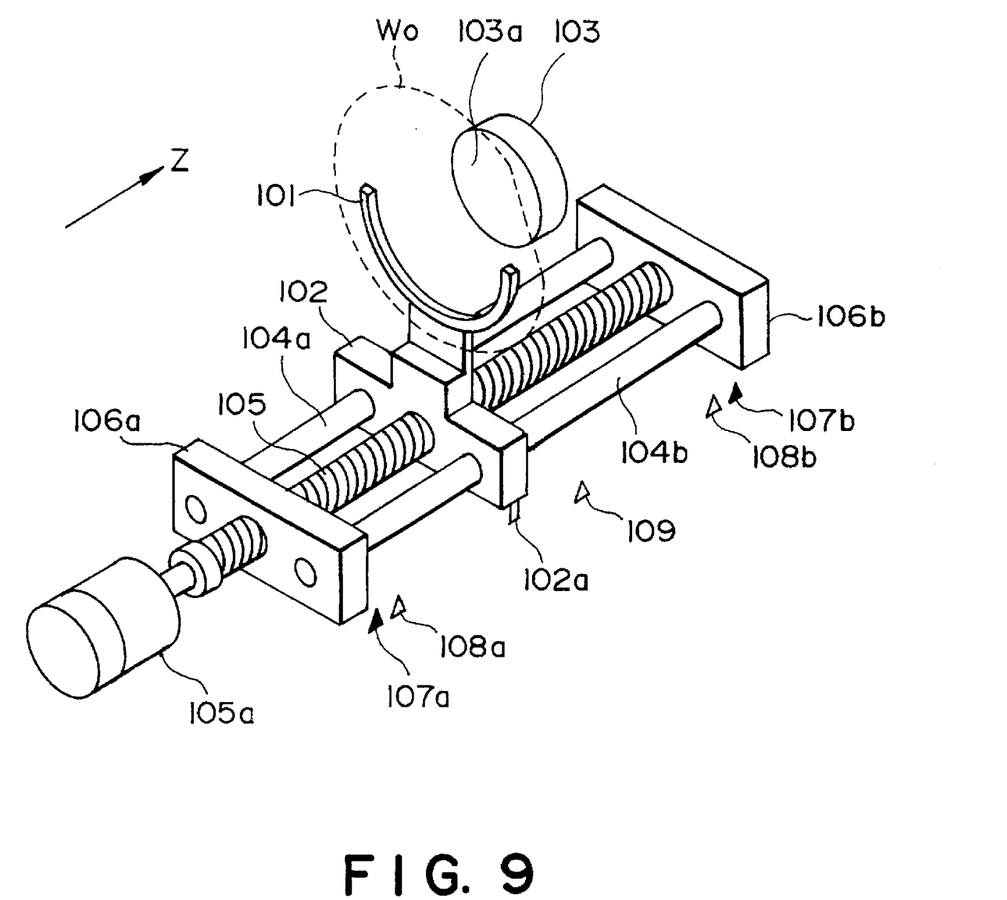
FIG. 9 is a perspective view of a known type substrate conveying system.

In semiconductor exposure apparatuses, for example, a substrate such as a mask or a wafer is conveyed from a predetermined container station or stand-by position to a mask stage or wafer stage by means of a hand. Then, the substrate is attracted to a mask chuck or wafer chuck of the stage, by which the substrate is positioned with respect to exposure light, for example. In recently developed X-ray exposure apparatuses which use radiation light (SOR light) from a charged particle accumulation ring, a vertical type positioning stage for holding a wafer vertically (upstanding position) in a reduced pressure chamber is used, FIG. 9 shows an example of a substrate conveying system for supplying a wafer to a vertical type positioning stage. It comprises a hand 101 for attracting an outside circumferential edge portion of a wafer $W_0$ through vacuum attracting force, a hand support 102 integral with the hand 101, a pair of guide rods 104a and 104b for guiding the hand support 102 in a direction (Z axis direction) perpendicular to the attraction surface 103a of a wafer chuck 103 of a wafer stage (not shown), a threaded rod 105 mesh engaged into a threaded hole of the support 102, and a pulse motor 105a for rotating the threaded rod 105. With rotation of the threaded rod 105, the hand support 102 is reciprocally moved between a pair of side plates 106a and 106b along the guide rods 104a and 104b. At a position close to the side plate 106a which is in front of the attraction surface 103a of the wafer chuck 103, the hand 101 receives a wafer $W_0$ from a conveying means (not shown), for example. After this, the hand 101 moves toward the side plate 106b which is at the back of the wafer chuck 103. During this movement, transfer of the wafer $W_0$ from the hand 101 to the wafer chuck is performed. During the movement of the hand 101 in the reverse direction, an exposed wafer is transferred from the wafer chuck 103 to the hand 101.

Light blocking member 102a is provided at the bottom of the hand support 102, integrally therewith. Along the path of movement of the light blocking member 102a which is movable together with the hand support 102, there are first and second stroke limit sensors 107a and 107b which are disposed at the position most remote from the wafer chuck 103 in the forward direction and at the position most remote from the wafer chuck 103 in the backward direction, respectively. Between the first and second stroke limit sensors, there are first and second position sensors 108a and 108b. At the position where transfer of a wafer $W_0$ between the hand 101 and the wafer chuck 103 is to be performed, there is a proximity sensor 109.

The stroke limit sensors 107a and 107b each is arranged so that an abnormality signal is produced and applied to a controller of the pulse motor 105a in response to passage of the light blocking member 102a across the sensor, whereby the pulse motor 105a and thus, the hand 101 are stopped promptly. The position sensors 108a and 108b are photosensors for detecting the arrival of the hand at the opposite ends, respectively, of the movement path of the same, that is, the origin position of the start of the run in the Z axis direction of the hand 101 and the reverse motion start position where movement in the reverse direction starts. The proximity sensor 109 is provided at the wafer transfer position, as described, where the wafer $W_0$ is to be transferred. It is a photosensor for detecting the presence of the hand 101, running along its movement path, within a predetermined range about the wafer transfer position. It serves as a safety device so that, if the hand 101 comes close to the wafer transfer position at a timing earlier than an expected, due to uncontrolled rotation of the pulse motor 105a, for example, or if the timing of attraction release of the hand 101 becomes inaccurate, for example, an abnormality signal is produced by the sensor to stop the hand 101 promptly.

In other words, the stroke limit sensors 107a and 107b each serves to prevent movement of the hand 101 beyond the origin position or the reverse motion start position, causing interference with the side plate 106a or 106b. The position sensors 108a and 108b are connected to a counting circuit for detecting the movement distance of the hand 101 between the origin position and the reverse motion start position. The counting circuit starts counting of the number of driving pulses in response to the output of the position sensor 108a or 108b.

The proximity sensor 109 detects the presence of the hand 101 as the same is placed within a predetermined range about the wafer transfer position, as described above.

Figure 10:
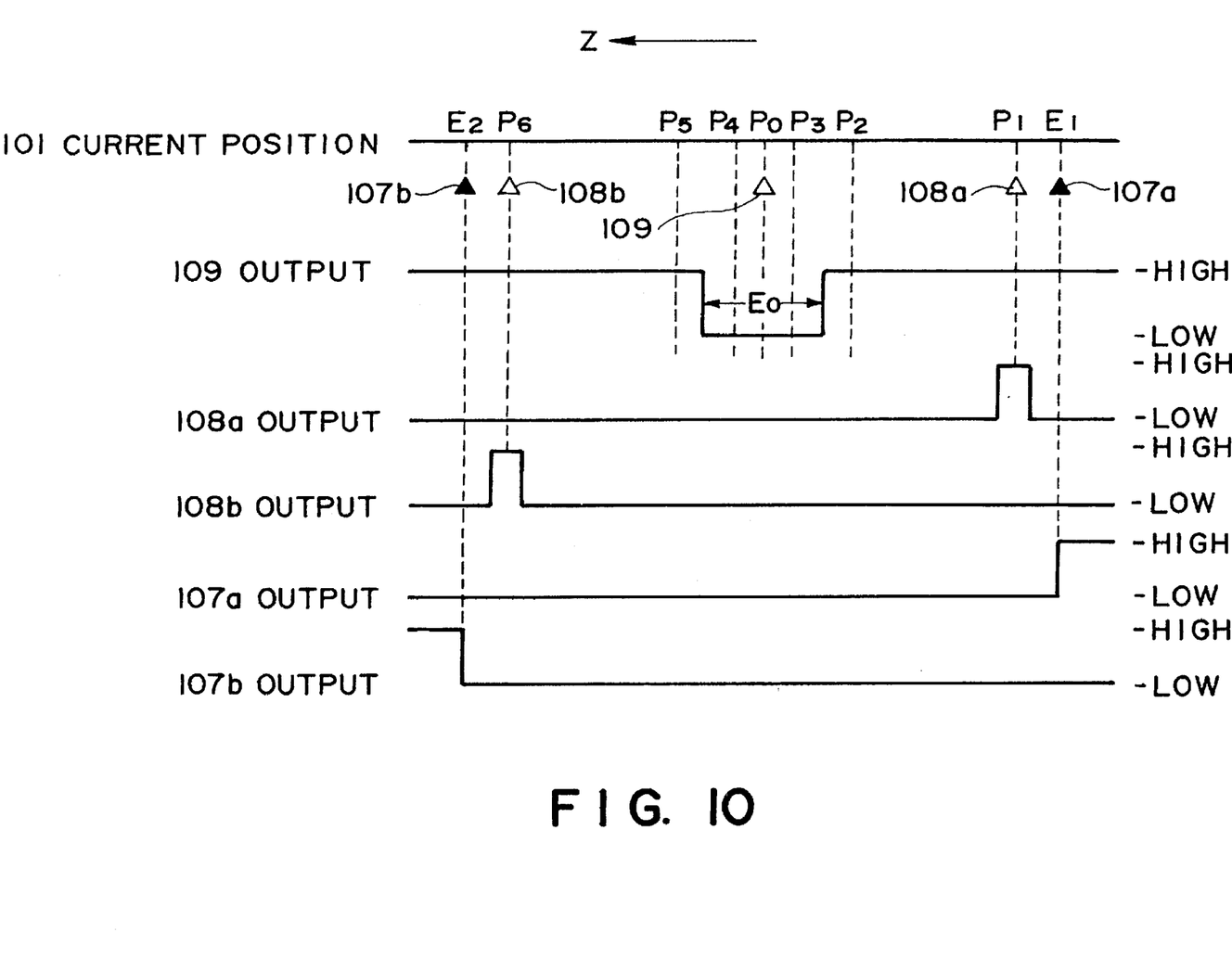
FIG. 10 is a chart for explaining the relationship between the running path of a hand and outputs of sensors of the FIG. 9 example.

FIG. 10 illustrates the process of the hand 101, having received a wafer $W_0$ from a conveyer means, for example, and being moved toward the wafer chuck 103, transferring the wafer $W_0$ to the wafer chuck and the process of the hand receiving the exposed wafer from the wafer chuck 103 and going back to the origin position, as well as the output timing of the stroke limit sensors 107a and 107b, of the position sensors 108a and 108b and of the proximity sensor 109. First, at the origin position $P_1$, the counting of the number of driving pulses Of the pulse motor 105a through the counting circuit starts. The counting circuit sequentially signals the current position of the hand 101 being run to a computer, not shown. The unshown computer serves to perform attraction start and attraction release of the hand 101 and the wafer chuck 103 in accordance with a preset program, in the manner to be described below.

When the hand 101 having the wafer $W_0$ attracted thereto moves through a predetermined distance from the origin position $P_1$ and it reaches a wafer chuck attraction start position $P_2$, attraction of the wafer chuck 103 starts. As the hand 101 further moves through a predetermined distance from that position and it reaches a hand attraction release position $P_4$, attraction of the hand 101 is stopped and the wafer is released. During movement of the hand 101 from the wafer chuck attraction start position $P_2$ to the hand attraction release position $P_4$, transfer of the wafer $W_0$ is performed at the wafer transfer position $P_0$. The hand 101 having transferred the wafer $W_0$ to the wafer chuck 103 continues its movement along the Z axis direction, and it stops at a reverse motion start position $P_6$.

On the other hand, the wafer chuck 103 having received the wafer $W_1$ moves to a predetermined exposure position (not shown) through the drive of the wafer stage described hereinbefore. After exposure of the wafer is completed, it moves back to the wafer transfer position. Subsequently, the hand 101 which is at the reverse motion start position $P_6$ is driven toward the origin position $P_1$. As the hand moves through a predetermined distance from the reverse motion start position $P_6$ and it reaches a hand attraction start position $P_5$, attraction of the hand 101 starts. As the hand 101 further moves toward the origin position $P_1$ and it reaches a wafer chuck attraction release position $P_3$, the attraction of the wafer chuck 103 is stopped and the wafer is released. During the motion of the hand 101 from the hand attraction start position $P_5$ to the wafer chuck attraction release position $P_3$, transfer of the wafer is performed at the wafer transfer position $P_0$. The hand 101 having received the wafer from the wafer chuck 103 continues its motion, and it stops at the origin position $P_1$.

If the hand 101 moves beyond the origin position $P_1$ or the reverse motion start position $P_6$ and it reaches its stroke end $E_1$ or $E_2$, through the stroke end limit sensor 107a or 107b, an abnormality signal is produced and applied to the controller of the pulse motor 105a, in response to which the pulse motor 105 is stopped promptly.

Also, even if the counting circuit produces no output regardless of that the hand 101 moves between the origin position $P_1$ and the reverse motion start position $P_6$ and comes into the operational range $E_0$ of the proximity sensor 109 (due to erroneous setting of the number of driving pulses to the counting circuit or uncontrolled running of the hand 101, for example), and an abnormality signal is produced and applied to the controller of the pulse motor 105a, by which the hand 101 is stopped promptly. This prevents collision of the wafer $W_0$ against the wafer chuck 103, causing damage of the wafer, on it avoids dropping of the wafer $W_0$ due to the failure to start the attraction by the wafer chuck 103. Also, if, during the period in which the hand 101 having the wafer transfer completed moves through the operational range $E_0$ of the proximity switch 109, the attraction release at the transferring side is not executed, and an abnormality signal is produced and applied to the controller of the pulse motor 105a, by which the hand is stopped promptly to prevent damage to the wafer.

In this manner, a wafer is transferred automatically between the hand 101 and the wafer chuck 103, and if, for example, overrunning of the hand 101 or erroneous operation in respect to the preset timing of the attraction release occurs, the hand 101 is stopped promptly, to thereby prevent dropping or damage to the wafer.

SUMMARY OF THE INVENTION

In the arrangement described hereinbefore, however, in order to set the timing of the attraction release at the transferring side, first the wafer transfer position should be detected very precisely. To this end, it is necessary to use a very high precision and expensive measuring device. Also, the safety device for prompt stoppage of the hand for preventing dropping or damage to the wafer uses a proximity sensor. Thus, it is necessary to adjust and maintain the placement position of the proximity sensor with respect to the wafer transfer position very strictly. In order to set the placement position of such proximity sensor quite exactly, skills and complicated operations are required. Thus, the assembling of the system becomes very complicated, which leads to a large increase in the manufacturing cost.

Further, since in an X-ray exposure apparatus the wafer transfer is carried out within a reduced pressure chamber, there is a possibility that the supporting member of the hand or the wafer chuck is deformed due to the reduced pressure. If this occurs, the placement position of the proximity sensor may deviate significantly damaging the reliability of the safety device.

It is, accordingly, an object of the present invention to provide an improved substrate conveying system which does not need use of an expensive measuring device or use of a proximity switch, which requires complicated assembling operation, thus ensuring decreased assembling cost and maintenance cost and also assuring improved safety to prevent dropping or damage of the wafer.

It is another object of the present invention to provide an improved exposure apparatus or a device manufacturing method which uses such a substrate conveying system.

In accordance with an aspect of the present invention, there is provided a substrate conveying system, comprising: attracting means for attracting a substrate with reduced pressure; moving means for moving the substrate relative to said attracting means; and detecting means for detecting the pressure of the attracting means during the relative movement of the substrate to thereby obtain positional information related to the substrate.

In accordance with another aspect of the present invention, there is provided a substrate conveying system, comprising: first and second attracting means each for attracting a substrate with reduced pressure; moving means for moving the first attracting means relative to the second attracting means while the substrate is being attracted to one of the first and second attracting means; and detecting means for detecting the pressure of at least one of the first and second attracting means during the relative movement of the first attracting means, to thereby obtain positional information related to the substrate.

The system may further comprise control means for controlling the reduced pressure of at least one of the first and second attracting means on the basis of an output of the detecting means.

The system may further comprise control means for controlling the relative movement of the first attracting means on the basis of an output of the detecting means.

In one preferred form of the substrate conveying system according to any one of these aspect of the present invention, transfer of the substrate may be performed between the first and second attracting means, and the position thereof may be detected on the basis of a change in the output of the pressure detecting means. For example, when the second attracting means is to receive the substrate (substrate receiving side), the position of the first attracting means at the moment at which that pressure reaches at a predetermined vacuum attracting force may be discriminated as the substrate transfer position, and on the basis of this, the timing of attraction start or attraction release of the first and second attracting means may be set. This eliminates the necessity of using expensive measuring device for setting the timing of attraction start and attraction release, to specify the substrate transfer position.

If any error occurs and attraction release of the first attracting means is not performed, the substrate is pulled by the first attracting means away from the second attracting means. Thus, the pressure thereat increases beyond the predetermined vacuum pressure. An abnormality signal may be produced on the basis of the output of the pressure detecting means at the moment as the pressure at the second attracting means reaches a predetermined upper limit pressure, to stop the first attracting means promptly. This effectively avoids damage of the substrate.

If the first attracting means runs uncontrollably before the start of attraction of the second attracting means and the substrate collides against the second attracting means, the substrate is pulled away from the first attracting means. This increases the pressure at the first attracting means beyond a predetermined vacuum attraction force. An abnormality signal may be produced on the basis of the output of the pressure detecting means at the moment as the pressure at the first attracting means reaches a predetermined upper limit pressure, to stop the first attracting means promptly. This effectively avoids damage to or dropping of the substrate.

In accordance with a further aspect of the present invention, there is provided a device manufacturing method, comprising the steps of: moving a substrate relative to attracting means for attracting the substrate with reduced pressure; detecting the pressure of the attracting means during the relative movement, to obtain positional information related to the substrate; and exposing the substrate, being held by the attracting means through attraction, with radiation so that a pattern is printed on the substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Now, preferred embodiments of the present invention will be described with reference to the drawings.

Figure 1:
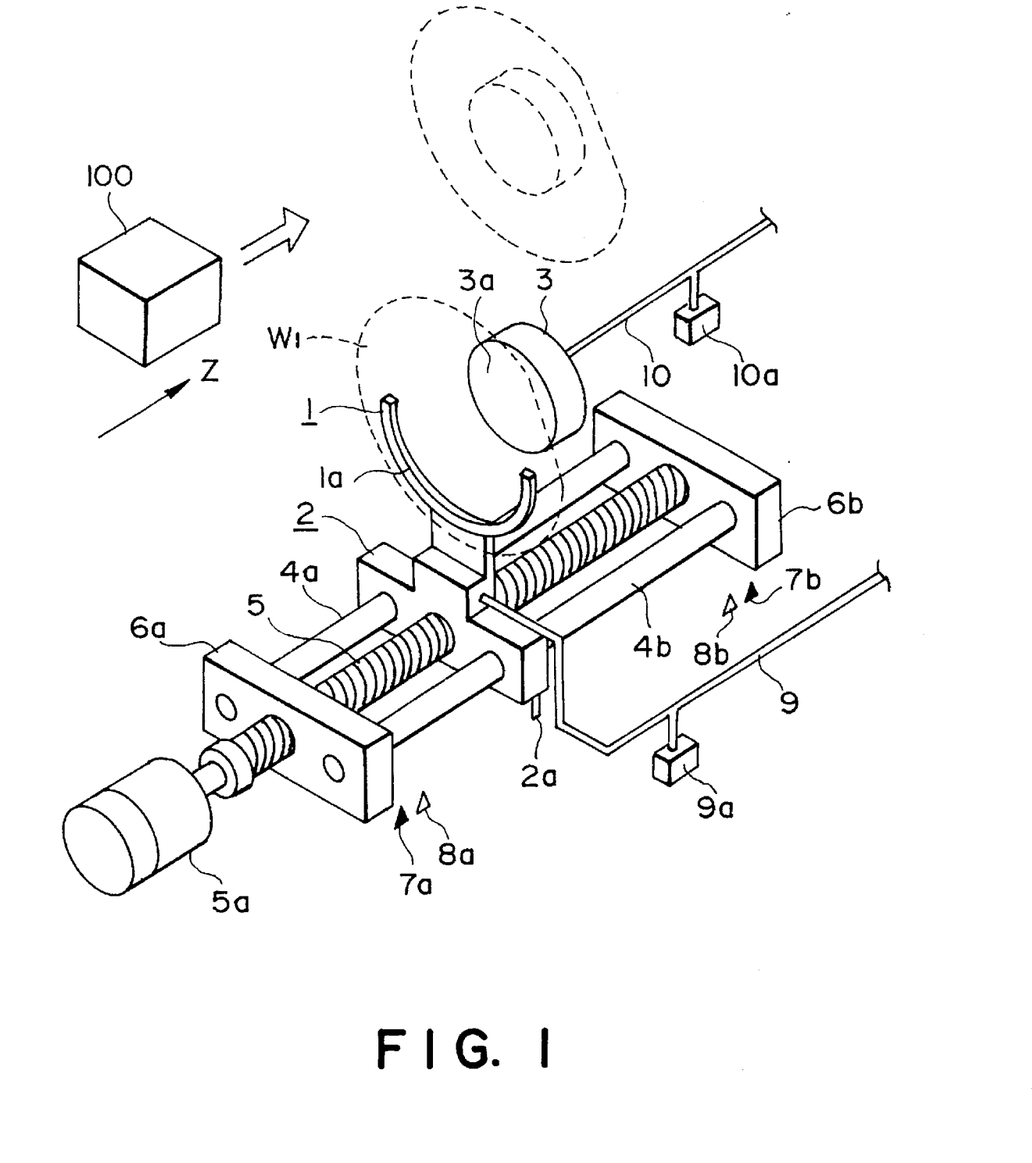
FIG. 1 is a perspective view of a substrate conveying system according to an embodiment of the present invention.

FIG. 1 is a schematic view for explaining a substrate conveying system according to an embodiment of the present invention. This substrate conveying system is adapted to he used in an exposure apparatus which uses X-rays such as SOR light as exposure radiation. The substrate conveying system comprises a hand (first attracting means) 1 for attracting an outside circumferential edge portion of a wafer $W_1$ through a predetermined vacuum attracting force, a hand support 2 being integral with the hand 1, a pair of guide rods 4a and 4b for guiding the hand support 2 in a direction (Z axis direction) perpendicular to the attraction surface 3a of a wafer chuck (second attracting means) 3 of a wafer stage, a threaded rod 5 being mesh engaged into a threaded hole of the support 2, and a pulse motor 5a for rotating the threaded rod 5. With rotation of the threaded rod 5, the hand support 2 is reciprocally moved between a pair of side plates 6a and 6b along the guide rods 4a and 4b. At a position close to the side plate 6a which is in front of the attraction surface 3a of the wafer chuck 3, the hand 1 receives a wafer $W_1$ from a conveying means (not shown), for example. After this, the hand 1 moves toward the side plate 6b which is at the back of the wafer chuck 3. During this movement, transfer of the wafer $W_1$ from the hand 1 to the wafer chuck 3 is performed. During the movement of the hand 1 in the reverse direction, the wafer having been exposed is transferred from the wafer chuck 3 to the hand 1. The exposure of the wafer is done by moving the wafer chuck 3, having received the wafer, upwardly to an exposure position and by projecting exposure light from a light source (exposure means) 100 to the wafer through a mask.

Light blocking member 2a is provided at the bottom of the hand support 2, integrally therewith. Along the path of movement of the light blocking member 2a which is movable together with the hand support 2, there are first and second stroke limit sensors 7a and 7b which are disposed at the position most remote from the wafer chuck 3 in the forward direction and at the position most remote from the wafer chuck 3 in the backward direction, respectively. Between the first and second stroke limit sensors, there are first and second position sensors 8a and 8b.

The stroke limit sensors 7a and 7b each is arranged so that an abnormality signal is produced and applied to a controller of the pulse motor 5a in response to passage of the light blocking member 2a across the sensor, whereby the pulse motor 5a and thus the hand 1 are stopped promptly. The position sensors 8a and 8b are photosensors for detecting arrival of the hand at the origin position and the reverse motion start position, respectively, of the movement path of the same.

In other words, the stroke limit sensors 7a and 7b each serves to prevent movement of the hand 1 beyond the origin position or the reverse motion start position, causing interference with the side plate 6a or 6b. The position sensors 8a and 8b are connected to a counting circuit for detecting the movement distance of the hand 1 between the origin position and the reverse motion start position. The counting circuit starts counting of the number of driving pulses in response to the output of the position sensor 8a or 8b.

By means of a hand vacuum line (reduced pressure means) 9 which is connected to an inside piping of the hand support 2, a predetermined vacuum attracting force is produced at the attraction surface 1a of the hand 1. The pressure at the attraction surface 1a of the hand 1 is detected by a hand pressure sensor 9a which is provided in a portion of the hand vacuum line 9. Similarly, by means of a wafer chuck vacuum line (reduced pressure means) 10 which is connected to an inside piping of the wafer chuck 3, a predetermined vacuum attracting force is produced at the attraction surface 3a of the wafer chuck 3. The pressure at the attraction surface 3a of the wafer chuck 3 is detected by a wafer chuck pressure sensor 10a, which sensor is provided in a portion of the wafer chuck vacuum line 10 and which cooperates with the hand pressure sensor 9a to provide pressure detecting means.

Figure 5:
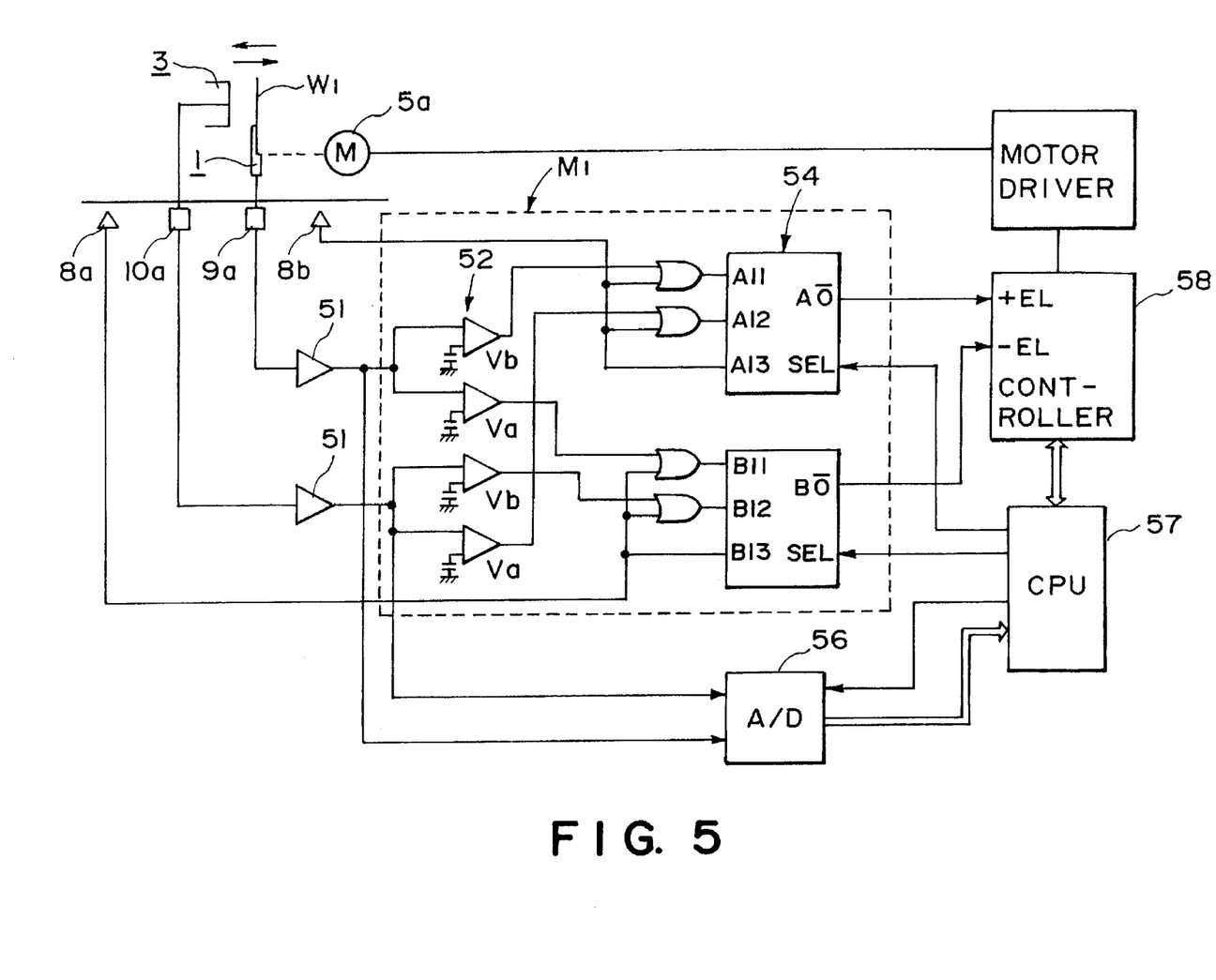
FIG. 5 is a block diagram of an abnormality discriminating circuit.

As shown in FIG. 5, the outputs of the hand pressure sensor 9a and the wafer chuck pressure sensor 10a are applied to a CPU (computer) 57 (control means) of the substrate conveying system via respective amplifiers 51. Also, these outputs are applied to comparator means 52 of an abnormality discriminating circuit (abnormality signal producing means) $M_1$. The comparator means 52 is connected to abnormality signal input terminals +EL and −EL of a controller 58 of the pulse motor 5a via selector means 54.

The CPU 57 serves to detect the current position of the hand 1 in its running path, from the number of driving pulses of the pulse motor 5a. Also, it serves to detect the wafer transfer position (substrate transfer position) beforehand on the basis of the output of the hand pressure sensor 9a and/or the wafer chuck pressure sensor 10a, and it memorizes that position. The CPU further serves to produce signals for attraction start and attraction release at predetermined timings, and to apply them to opening/closing valves of the hand vacuum line 9 and the wafer chuck vacuum line 10, respectively. On the other hand, the abnormality discriminating circuit $M_1$ serves to produce and apply an abnormality signal to the controller 58 as a first abnormal voltage Va or a second abnormal voltage Vb, which are set in a manner to be described later, is detected on the basis of the output of the CPU 57, to thereby stop the pulse motor 5a promptly.

The CPU operates to perform automatic wafer transfer process. More specifically, as the hand 1 receives a wafer $W_1$ from a conveyer means, for example, and it reaches the origin position, the CPU 57 operates to start counting of the number of driving pulses through the counting circuit described hereinbefore, and to detect the current position of the hand 1 in its running path which hand is running from the origin position toward the reverse motion start position. At a predetermined timing, the CPU operates to start attraction of the wafer chuck 3 through the wafer chuck vacuum line 10. Also, it serves to release attraction of the hand 1 through the hand vacuum line 9 after the completion of the transfer of the wafer $W_1$ is discriminated on the basis of the output of the wafer chuck pressure sensor 10a. This is the wafer transfer process from the hand 1 to the wafer chuck 3. The CPU further operates to perform automatic wafer transfer process for transferring a wafer from the wafer chuck 3 back to the hand 1.

Now, details of the CPU 57 and the abnormality discriminating circuit $M_1$ will be described.

Figure 2:
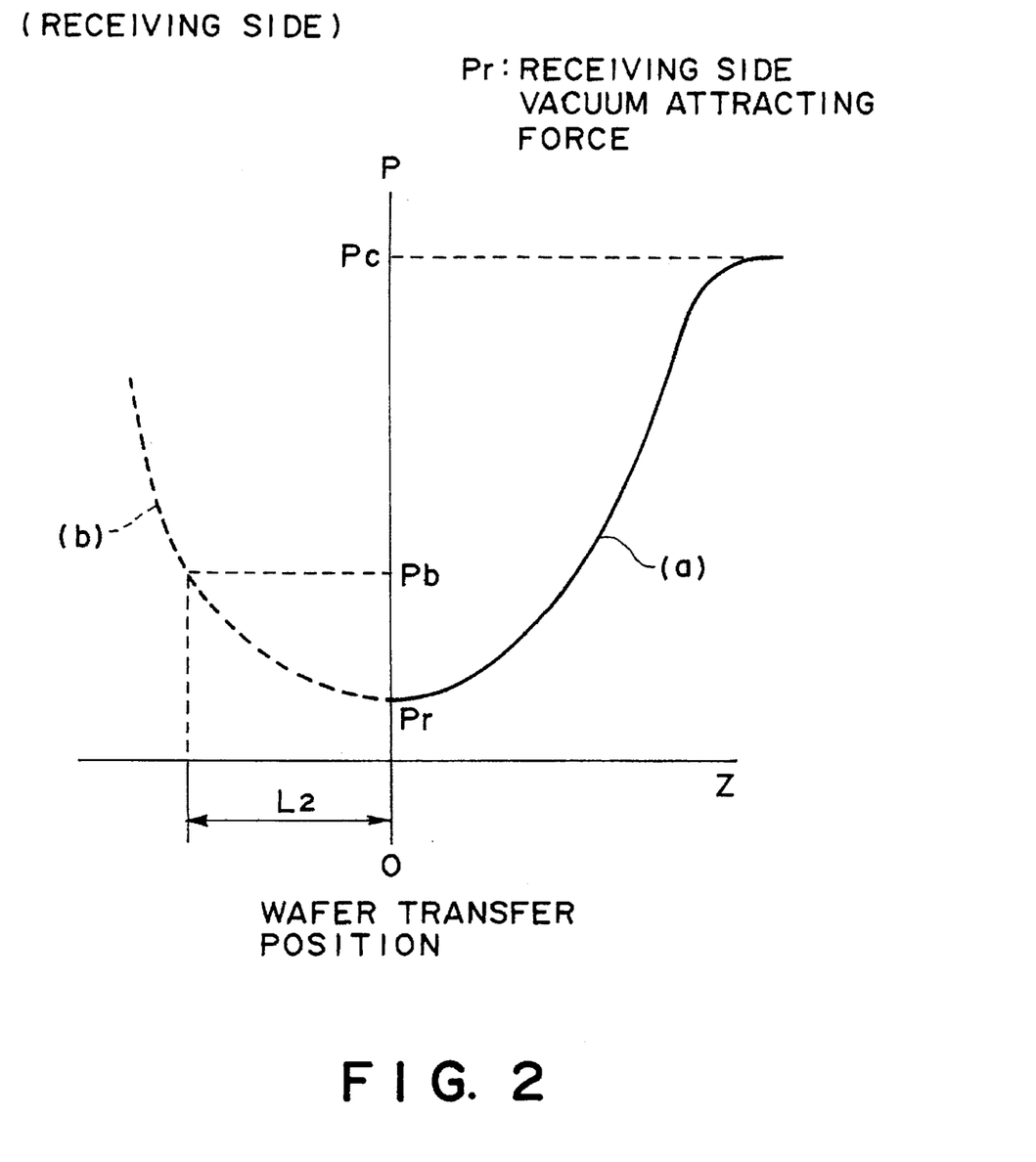
FIG. 2 is a graph for explaining changes in pressure at the attracting surface of a hand or a wafer chuck which is at the wafer receiving side.

As a wafer $W_1$ contacts the attraction surface 3a of the wafer chuck 3, the output of the wafer chuck pressure sensor 10a decreases to a receiving side vacuum attracting force Pr of FIG. 2 from the ambience pressure Pc, along a curve (a) in FIG. 2. The current position of the hand 1 at this moment corresponds to the wafer transfer position O, and it is memorized into the CPU 57 via an analog-to-digital (A/D) converter 56 of FIG. 5. Thus, the CPU 57 releases the attraction of the hand 1 at a predetermined timing.

Figure 3:
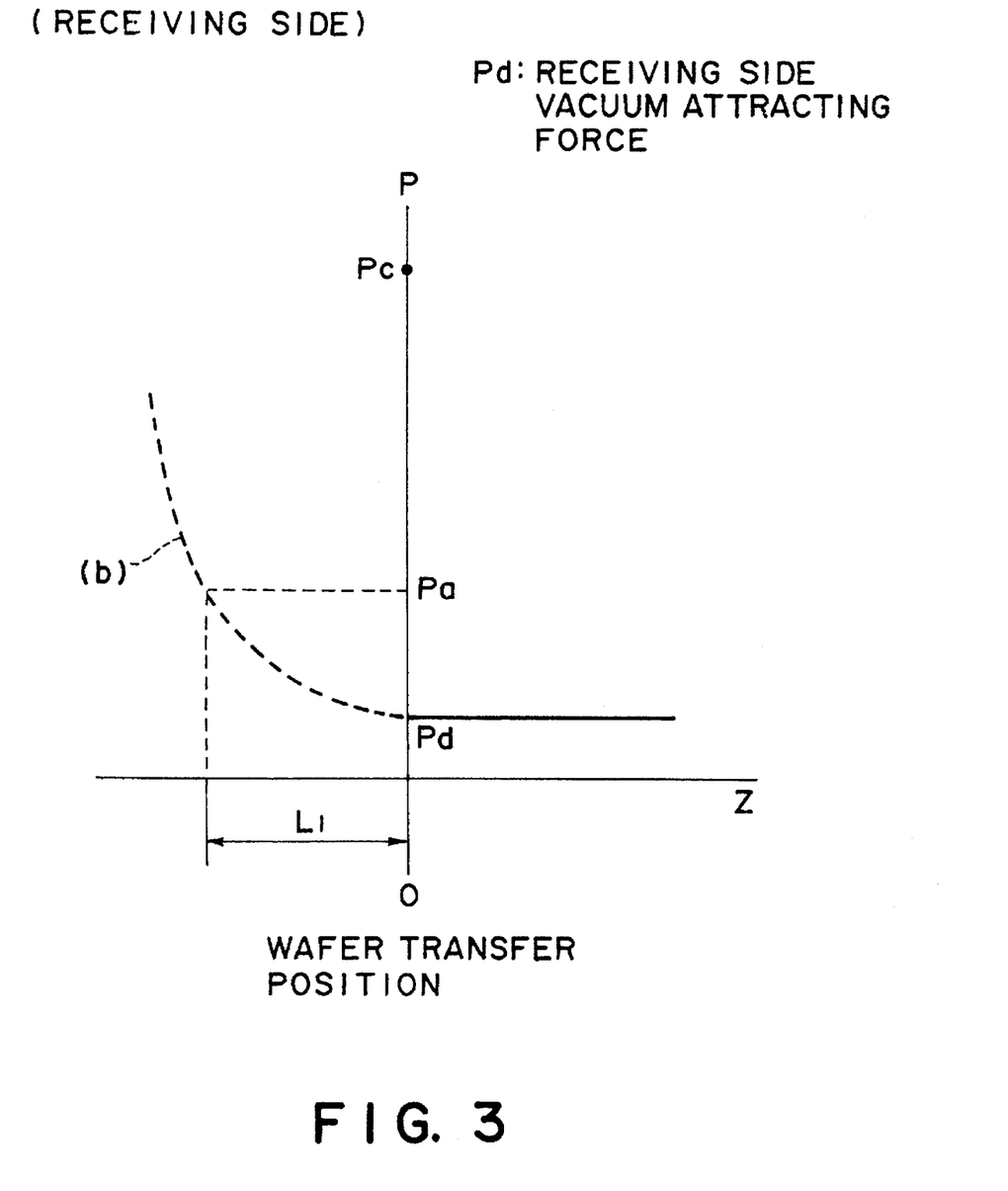
FIG. 3 is a graph for explaining changes in pressure at the attracting surface of a hand or a wafer chuck which is placed at the wafer transferring side (wafer sending side.).

On the other hand, before the wafer transfer position O, the hand 1 keeps the wafer $W_1$ attracted thereto. Thus, the output of the hand pressure sensor 9a is maintained at a transferring side (sending side) vacuum attracting force Pd of FIG. 3. As the hand 1 reaches the wafer transfer position O, and after the completion of wafer transfer is discriminated on the basis of the output of the wafer chuck pressure sensor 10a, the CPU 57 operates to release the attraction of the hand 1. The output of the hand pressure sensor 9a immediately increases to the ambience pressure Pc.

If, however, the hand 1 overruns beyond the wafer transfer position O, because of an error in the set pulse number of the counting circuit or due to uncontrolled run of the hand 1, for example, the attraction release of the hand 1 is not carried out. The wafer $W_1$ is pulled away from the hand 1 with the collision against the wafer chuck 3. Thus, the output of the hand pressure sensor 9a increases along a curve (b) of FIG. 3. In consideration of the above, this embodiment, if the hand 1 overruns beyond the wafer transfer position by a distance corresponding to a first overrun tolerance $L_1$ and the output of the hand pressure sensor 9a increases to a preset abnormal pressure level Pa, corresponding to an upper limit of the curve (b) of FIG. 3, it is discriminated as an abnormality, and a first abnormal voltage Va is set for the comparator 52 of FIG. 5 at the side connected to the hand pressure sensor 9a.

Also, if the attraction of the hand vacuum line 9 is not released even though the hand 1 moves beyond the wafer transfer position O, the wafer $W_1$ is pulled by the hand 1 and is deformed thereby. Thus, the wafer is disengaged from the attracting surface 3a of the wafer chuck 3. As a result, the output of the wafer chuck pressure sensor 10a increases along a curve (b) of FIG. 2. In consideration of the above, in this embodiment, if the hand 1 overruns beyond the wafer transfer position O by a distance corresponding to a second overrun tolerance $L_2$ and the output of the wafer chuck pressure sensor 10a reaches a preset abnormal pressure level Pb which corresponds to an upper limit of the curve (b) of FIG. 2, it is discriminated as an abnormality, and a second abnormal voltage Vb is set for the comparator 52 of FIG. 5 at the side connected to the wafer chuck pressure sensor 10a.

During the process in which the exposure of the wafer $W_1$ having been transferred to the wafer chuck 3 is completed and the hand 1 moves from the reverse motion start position to the origin position and in which the wafer transfer from the wafer chuck 3 to the hand 1 is carried out, the hand 1 is placed at the receiving side and the wafer chuck 3 is placed at the transferring side (sending side). Thus, an abnormality in an inverse situation has to be detected. To this end, first and second abnormal voltages Va and Vb are set, respectively, at the comparators 52 of FIG. 5 at the side connected to the hand pressure sensor 9a and at the side connected to the wafer chuck pressure sensor 10a, respectively.

The outputs of the stroke limit sensors 7a and 78b, also, are applied to the selector means of the abnormality discriminating circuit $M_1$ and on the basis of the output of the CPU 57, they are applied to the abnormality signal input terminals +EL and −EL of the controller 58. Thus, it is so arranged that, also in a case where the hand 1 moves beyond the origin position or the reverse motion start position of its running path and reaches the corresponding stroke end, the pulse motor 5a is stopped promptly.

Transfer of the wafer $W_1$ between the hand 1 and the wafer chuck 3 is performed in the following manner. During the process in which the hand 1 having the wafer $W_1$ attracted thereto moves toward the reverse motion start position as depicted by an arrow A of FIG. 4 and in which the wafer $W_1$ is transferred to the wafer chuck 3, attraction of the wafer chuck 3 starts, as described, in response to a signal from the CPU 57 as the hand 1 has moved through a predetermined distance from the origin position. After the completion of wafer transfer is discriminated on the basis of the output of the wafer chuck pressure sensor 10a, the CPU 57 operates to release the attraction of the hand 1. In the case where, as just described, the transfer of the wafer $W_1$ is carried out correctly in accordance with a program set in the CPU 57, no output is applied to the selector 54 of the abnormality discriminating circuit $M_1$ from the comparator 52, detecting an abnormality signal. Therefore, no stop signal is applied to the controller.

Figure 4:
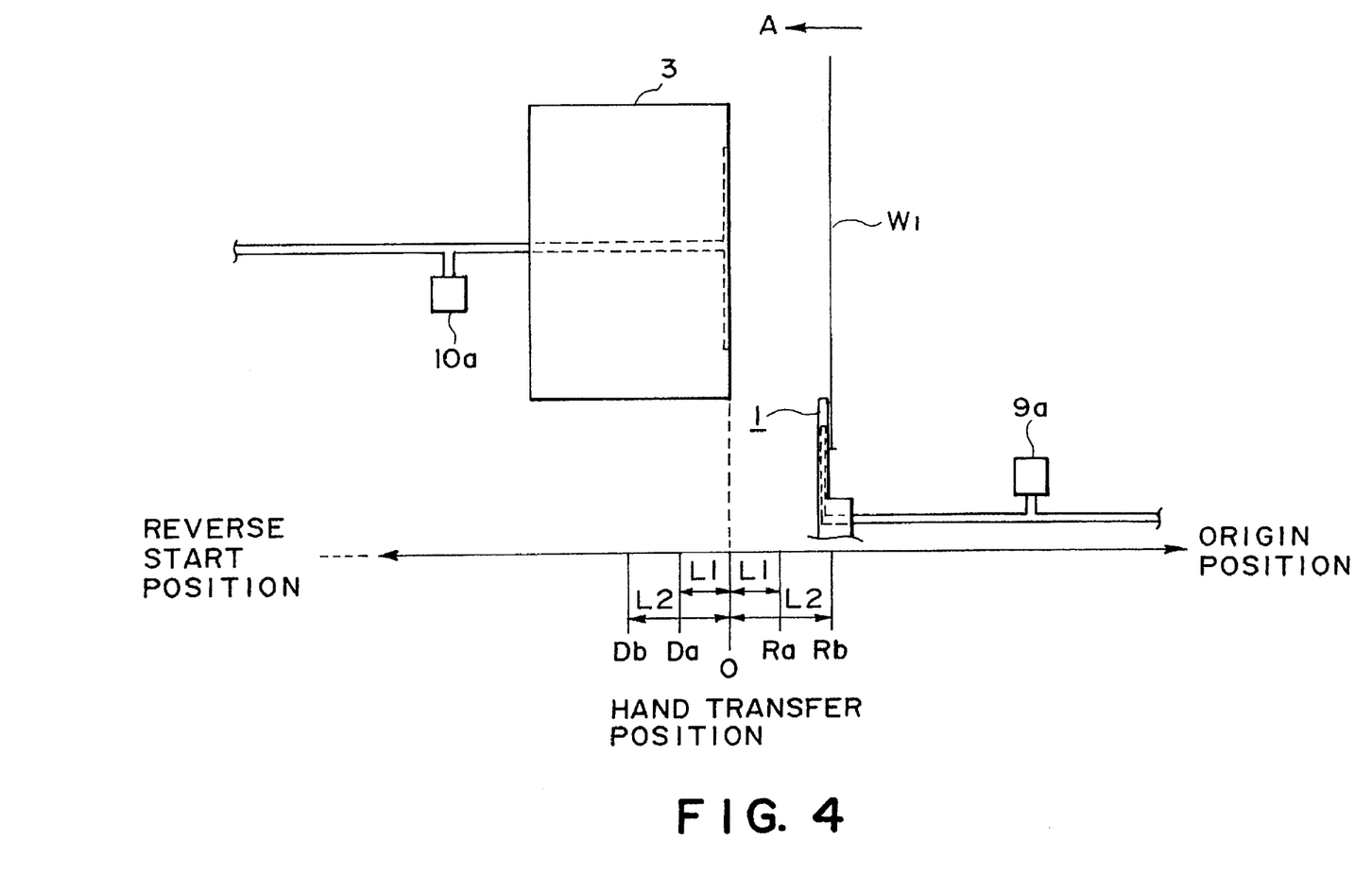
FIG. 4 is a schematic view for explaining the wafer transfer position and the prompt stoppage position of the hand.

If, due to uncontrolled run of the hand 1, for example, the attraction of the wafer chuck 3 is not initiated and the wafer $W_1$ collides against the attraction surface 3a of the wafer chuck 3, the output of the band pressure sensor 9a goes beyond the first abnormal voltage Va. Thus, the abnormality discriminating circuit $M_1$ produces and applies an abnormality signal to the controller 58, whereby the pulse motor 5a is stopped promptly. At this time, the hand 1 is flexed while keeping the wafer $W_1$ attracted, and it stops at a first emergency stoppage position Da at the reverse motion start position side, which is beyond the wafer transfer position O by a distance corresponding to the first overrun tolerance $L_1$. In this manner, damage of the wafer $W_1$ due to overrunning of the hand 1 or dropping of the wafer $W_1$ which might be caused if the attraction of the hand 1 is released before attraction of the wafer chuck 3 starts, is effectively avoided.

If the hand 1 moves to a second emergency stoppage position Db at the reverse motion start position side which is beyond the wafer transfer position O by a distance corresponding to the second overrun tolerance $L_2$, without accomplishing the release of attraction of the hand 1, the output of the wafer chuck pressure sensor 10a goes beyond the second abnormal voltage Vb. Thus, an abnormality signal is produced and applied to the controller 58, whereby the pulse motor is stopped promptly. In this manner, damage of the wafer $W_1$ is avoided effectively.

When the wafer is to be transferred to the hand 1 from the wafer chuck 3, the movement of the hand 1 may be stopped at first and second emergency stoppage positions Ra and Rb at the origin position side.

In accordance with this embodiment of the present invention, during transfer of a wafer between the hand and the wafer chuck, damage of the wafer or dropping of the wafer due to uncontrolled running of the hand or any error in the timing of the attraction start or attraction release, can be avoided. Additionally, since the wafer transfer position is discriminated on the basis or an output of the hand pressure sensor and/or the wafer chuck pressure sensor, it is not necessary to use expensive measuring means for detecting the wafer transfer position. Also, it is not necessary to provide a proximity sensor whose placement position should be set and maintained strictly. Therefore, this embodiment of the present invention largely enhances reduction in cost of the substrate conveying system. Moreover, the wafer transfer position can be detected correctly even if the substrate conveying system is disposed in a reduced pressure chamber or the like, there is small possibility of incorrect setting of the wafer transfer timing in the CPU. The function of preventing damage to the wafer or dropping of the wafer is performed.

Figure 6:
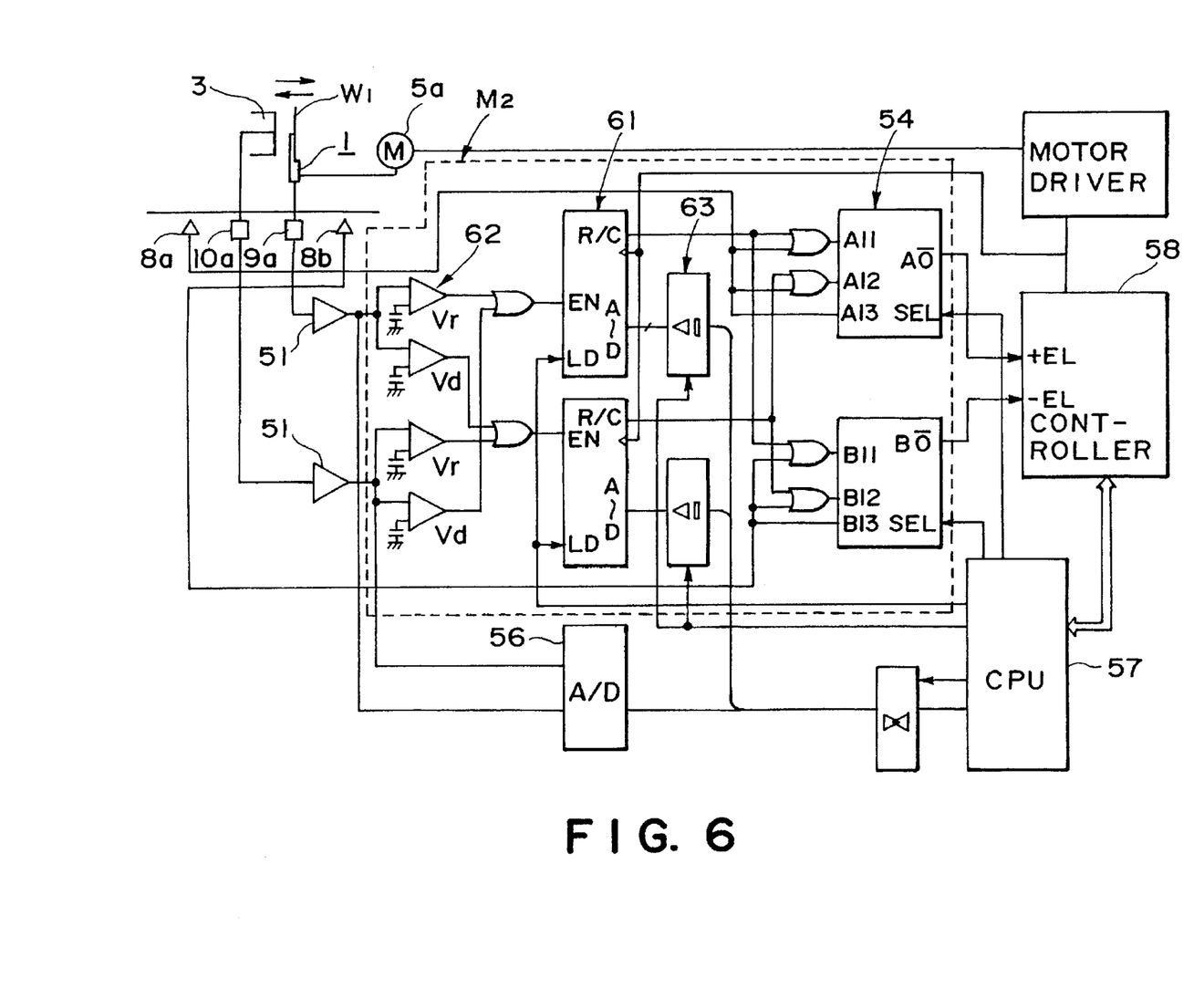
FIG. 6 is a block diagram of a modified form of an abnormality discriminating circuit.

FIG. 6 is a block diagram of a modified form of abnormality discriminating circuit $M_2$. In this example, in comparator means 62 similar to the comparator means 52, threshold voltages Vr and Vd (first and second thresholds) are set in accordance with the receiving side vacuum attracting force Pr and the transferring side (sending side) vacuum attracting force Pd. The comparator 62 is connected to selector means 54 via a counter 61, in which the numbers of driving pulses corresponding to the movements of the hand 1 through the first and second overrun tolerances $L_1$ and $L_2$, respectively, are memorized, and via a latch 63 for setting the number of driving pulses. The latch 63 is set on the basis of the output of the CPU 57.

More specifically, if in the process of transferring a wafer $W_1$ from the hand 1 to the wafer chuck 3 the attraction of the wafer chuck 3 is not initiated at a predetermined timing, a number of driving pulses corresponding to the first overrun tolerance $L_1$ is set in the latch 63 with the output of the CPU 57. Thus, in response to detection of an increase of the output of the hand pressure sensor 9a beyond the receiving side vacuum attracting force Pd, at the first emergency stoppage position Da, an abnormality signal is produced whereby the hand 1 is stopped promptly. Also, when the wafer transfer is completed, the output of the wafer chuck pressure sensor 10a is higher than the first threshold Vr, and the counter 61 is able to count the driving pulses. If in this state the output of the wafer chuck pressure sensor 10a increases, an abnormality signal is produced from the counter 61 when driving pulses of a number corresponding to the second overrun tolerance $L_2$ are counted, such that the hand 1 is stopped promptly.

Next, an embodiment of device manufacturing method according to an embodiment of the present invention, which is based on an exposure apparatus having 8 substrate conveying device as described above, will be explained.

Figure 7:
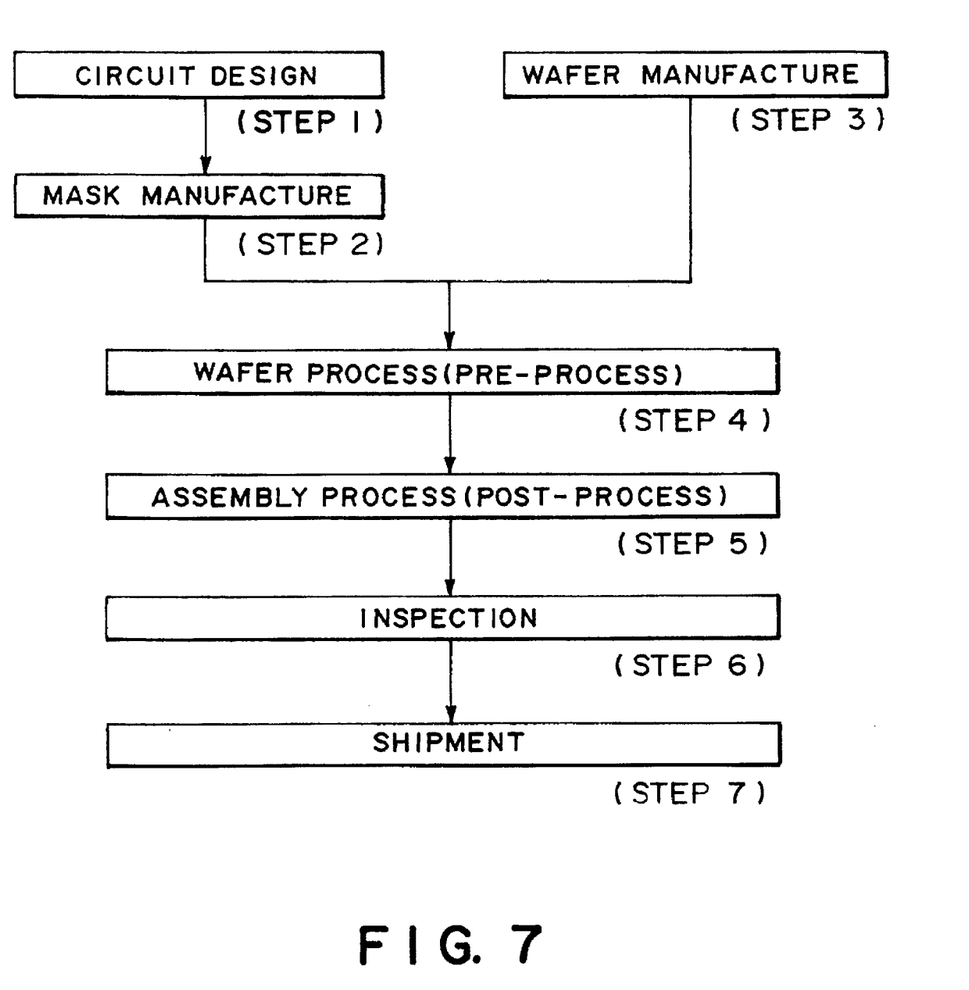
FIG. 7 is a flow chart of device manufacturing processes.

FIG. 7 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 8:
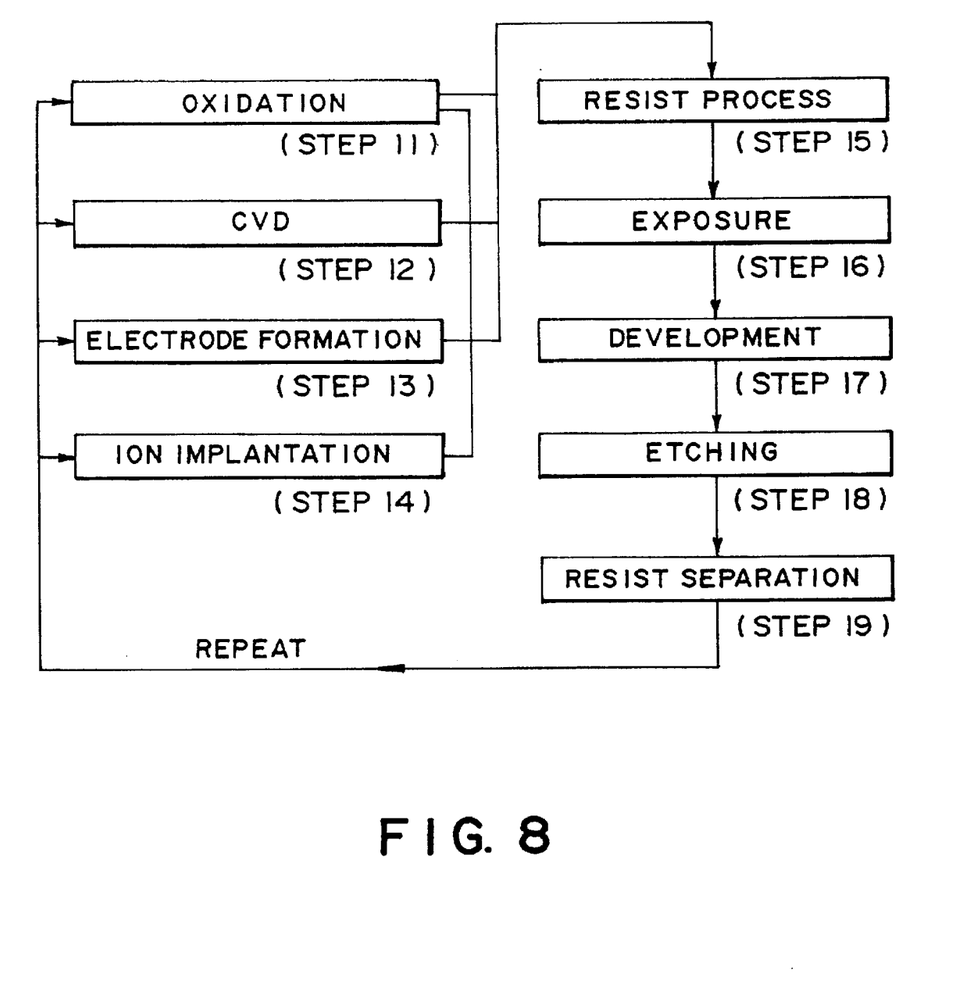
FIG. 8 is a flow chart of a wafer process.

FIG. 8 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are supposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A conveying system for conveying a substrate to be exposed with radiation, comprising:

attracting means for attracting the substrate with reduced pressure;

moving means for moving the substrate relative to said attracting means; and detecting means for detecting the pressure of said attracting means during the relative movement of the substrate to thereby obtain positional information related to the substrate.

2. A system according to claim 1, further comprising control means for controlling the reduced pressure of said attracting means on the basis of an output of said detecting means.

3. A system according to claim 1, further comprising control means for controlling the relative movement of the substrate on the basis of an output of said detecting means.

4. A system according to claim 3, wherein said control means serves to stop the relative movement of the substrate in response to an output of said detecting means.

5. A system according to claim 1, further comprising exposure means for exposing the substrate with X-ray radiation.

6. A substrate conveying system, comprising:

first and second attracting means each for attracting a substrate with reduced pressure;

moving means for moving said first attracting means relative to said second attracting means while the substrate is being attracted to one of said first and second attracting means; and detecting means for detecting the pressure of at least one of said first and second attracting means during the relative movement of said first attracting means, to thereby obtain positional information related to the substrate.

7. A system according to claim 6, further comprising control means for controlling the reduced pressure of at least one of the first and second attracting means on the basis of an output of said detecting means.

8. A system according to claim 6, further comprising control means for controlling the relative movement of the first attracting means on the basis of an output of said detecting means.

9. A system according to claim 8, wherein said control means serves to stop the relative movement of said first attracting means quickly in response to an output of said detecting means.

10. A system according to claim 6, further comprising exposure means for exposing the substrate with radiation.

11. A device manufacturing method, comprising the steps of:

moving a substrate relative to attracting means for attracting the substrate with reduced pressure;

detecting the pressure of the attracting means during the relative movement, to obtain positional information related to the substrate; and exposing the substrate, being held by the attracting means through attraction, with radiation so that a pattern is printed on the substrate.

12. A method according to claim 11, wherein the substrate comprises a semiconductor wafer.

* * * * *

UNITED STATES PATENT AND TRADEMARK OFFICE
CERTIFICATE OF CORRECTION

PATENT NO. : 5,640,440
DATED : June 17, 1997
INVENTOR(S) : KUNO ET AL.

It is certified that error appears in the above-identified patent and that said Letters Patent is hereby corrected as shown below:

COLUMN 1:
    Line 41 "chuck" should read --chuck 103--.

COLUMN 2:
    Line 36, "OF" should read --of--.
    Line 43, $W_o$attracted" should read --$W_o$ attracted--.

COLUMN 3:
    Line 19, "$E_o$of" should read --$E_o$ of--.

COLUMN 4:
    Line 36, "aspect" should read --aspects--.
    Line 48, "expensive" should read --an expensive--.

COLUMN 5
    Line 31, "side.)." should read --side).--.
    Line 38, "circuit," should read --circuit.--.
    Line 56, "he" should read --be--.

COLUMN 7:
    Line 67, "this" should read --in this--.

COLUMN 8:
    Line 37, "78b," should read --7b,--.

UNITED STATES PATENT AND TRADEMARK OFFICE
CERTIFICATE OF CORRECTION

PATENT NO. : 5,640,440
DATED : June 17, 1997
INVENTOR(S) : KUNO ET AL.

It is certified that error appears in the above-identified patent and that said Letters Patent is hereby corrected as shown below:

COLUMN 9:
    Line 1, "band" should read --hand--.

COLUMN 10:
    Line 15, "8" should read --a--.
    Line 53, "supposedly" should read --superposedly--.

COLUMN 12
    Line 11, delete, "quickly".

Signed and Sealed this

Third Day of February, 1998

Attest:

BRUCE LEHMAN

Attesting Officer     Commissioner of Patents and Trademarks